United States Patent [19]
Henrion

[11] 3,988,569
[45] Oct. 26, 1976

[54] THERMAL PRINTHEAD WITH MEMORY
[75] Inventor: W. S. Henrion, Houston, Tex.
[73] Assignee: Texas Instruments Incorporated, Dallas, Tex.
[22] Filed: Dec. 16, 1974
[21] Appl. No.: 533,427

[52] U.S. Cl. ............................. 219/216; 219/543; 346/76 R
[51] Int. Cl.² ........................................ H05B 1/00
[58] Field of Search .................. 219/216, 388, 543; 346/76 R

[56] References Cited
UNITED STATES PATENTS 3,385,957  5/1968  Munson et al. .................... 219/501
3,566,162  2/1971  Warrender ......................... 307/310

Primary Examiner—C. L. Albritton
Attorney, Agent, or Firm—Harold Levine; Rene E. Grossman; Thomas G. Devine

[57] ABSTRACT

A latching circuit is used in a thermal printhead matrix. The heater circuit in each mesa or element of the matrix, once energized by input logic signals, is thereafter independent of changes in the input logic signal levels and remains energized until the supply voltage is removed. This permits turning on the individual mesas in a matrix fashion thereby substantially reducing the number of input leads required to control the matrix.

7 Claims, 13 Drawing Figures

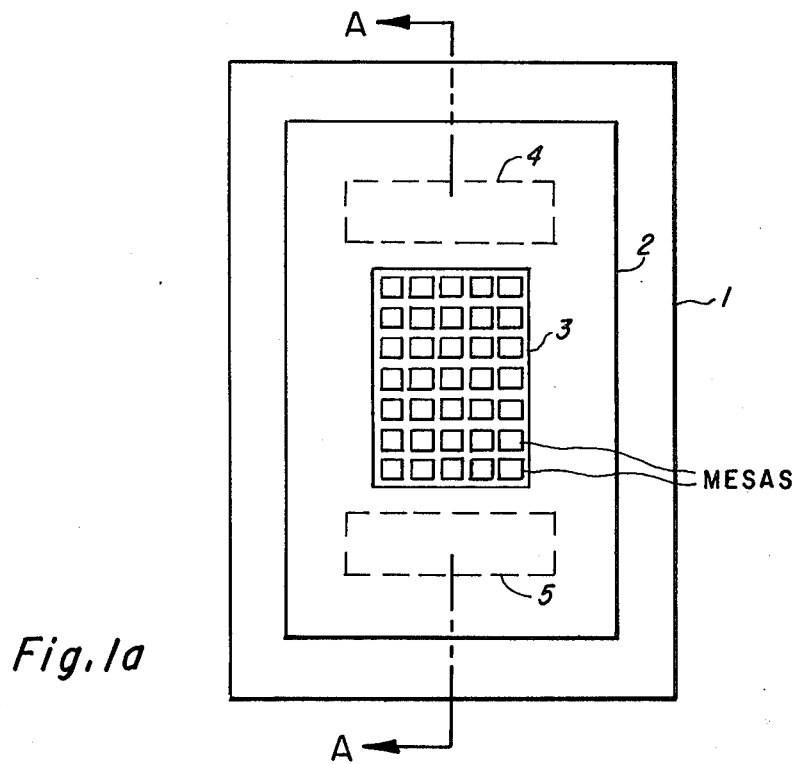
Fig.1a
Fig.1b
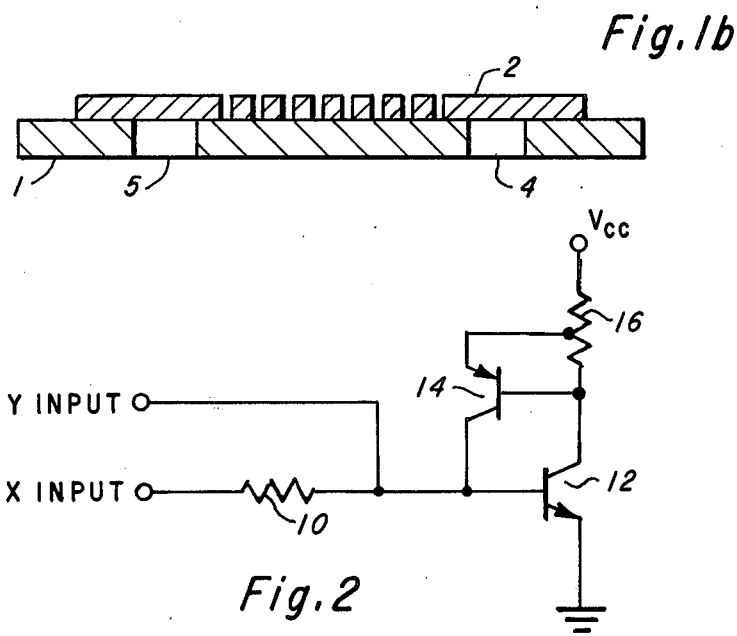
Fig.2

THERMAL PRINTHEAD WITH MEMORY

This invention relates to thermal printheads and in particular to a latching circuit for use in the individual mesas of a thermal printhead.

A related thermal printhead is disclosed and claimed in U.S. Pat. No. 3,601,669 to Merryman et al. and assigned to the assignee of the present invention. The printing element of such thermal printheads comprises a semiconductor wafer, a generally rectangular area of which is subdivided into a plurality of thermally and electrically isolated islands or "mesas" of semiconductor material. In a typical printhead there are five columns each containing seven such mesas. Thermally sensitive paper is located in contact with the portion of the semiconductor wafer containing the mesas. Each of the mesas contains, in integrated circuit form, a heater transistor which, when turned on by an external logic signal, serves to generate a hot-spot at the surface of the mesa. Each mesa is connected to a separate external logic signal thereby permitting independent control over the generation of hot-spots in the various mesas. By proper selection of the mesas to be energized, an alphanumeric or other character may be printed on the thermally sensitive paper.

In a printhead of the type described above having a 5×7 matrix of mesas, 35 signal lines are required to individually control excitation of the various mesas. In a typical application the thermal printhead is located in a carriage for lateral movement with respect to the thermally sensitive paper. The structure necessary to couple 35 signal lines to a translating printhead of this type is a substantial factor in the expense of the overall system. Further, experience has proven that this coupling structure is a limiting factor on the reliability of the overall system.

It is, therefore, an object of the invention to provide a thermal printhead structure wherein the number of signal wires required is substantially reduced below the number required by previously available printheads.

It is a further object of the invention to provide a thermal printhead matrix wherein the individual mesas may be turned on by X–Y coincidence addressing.

It is another object of the invention to provide a thermal printhead matrix wherein the individual mesas, once turned on, remain on until removal of the supply power.

Briefly, in accordance with the principles of the present invention, these and other objects are realized by a novel configuration for the heater circuit within each individual mesa. The heater element within each mesa comprises a latching circuit, which, when turned on, remains on even though the input signal which turned it on is removed. As a result, if the character is to be printed with a 5×7 matrix of mesas, for example, an X–Y coincidence addressing technique may be used. During a relatively brief address period the columns of mesas are strobed ON sequentially by signals appearing on the five column input lines. As each column is strobed, those mesas in the column which are to be heated are turned on by signals appearing on the seven row input lines. After all five columns have been strobed the mesas which have been addressed remain on for a print period which is long in comparison with the address period. After the print period, the supply voltage is removed from all mesas thereby turning them off in preparation for printing of the next character.

The use of the new mesa heater element permits control of a 35 element matrix with 12 input lines rather than the 35 lines required by previously available thermal printheads. Other methods of addressing can be employed such as fully encoded signals requiring only six address lines. This method will require decoding circuits at the printhead itself.

In the preferred embodiment of the invention, the latching type heater circuit includes a PNP and an NPN transistor. The emitter of the NPN transistor is coupled through a portion of a heater resistor to a positive supply voltage $V_{CC}$. The base of the NPN transistor, which in the mesa structure also comprises the collector of the PNP transistor, is coupled through appropriate impedances to the X and Y addressing logic signals. The collector of the NPN transistor, which also comprises the base of the PNP transistor, is coupled through the heater resistor to $V_{CC}$. The voltage drop generated across a portion of the heater resistor by the NPN transistor current biases the PNP transistor on, thereby providing driver transistor current to drive the base of the NPN transistor. This regenerative action rapidly builds up and maintains turn on drive to the NPN transistor independent of subsequent changes in the logic signal levels.

Other objects and features of the invention will be made clear by a consideration of the following detailed description together with accompanying drawings wherein:

FIGS. 1a and 1b illustrate a thermal printhead structure.

FIG. 2 is a schematic diagram of the heater network of the invention.

Figure 3A:
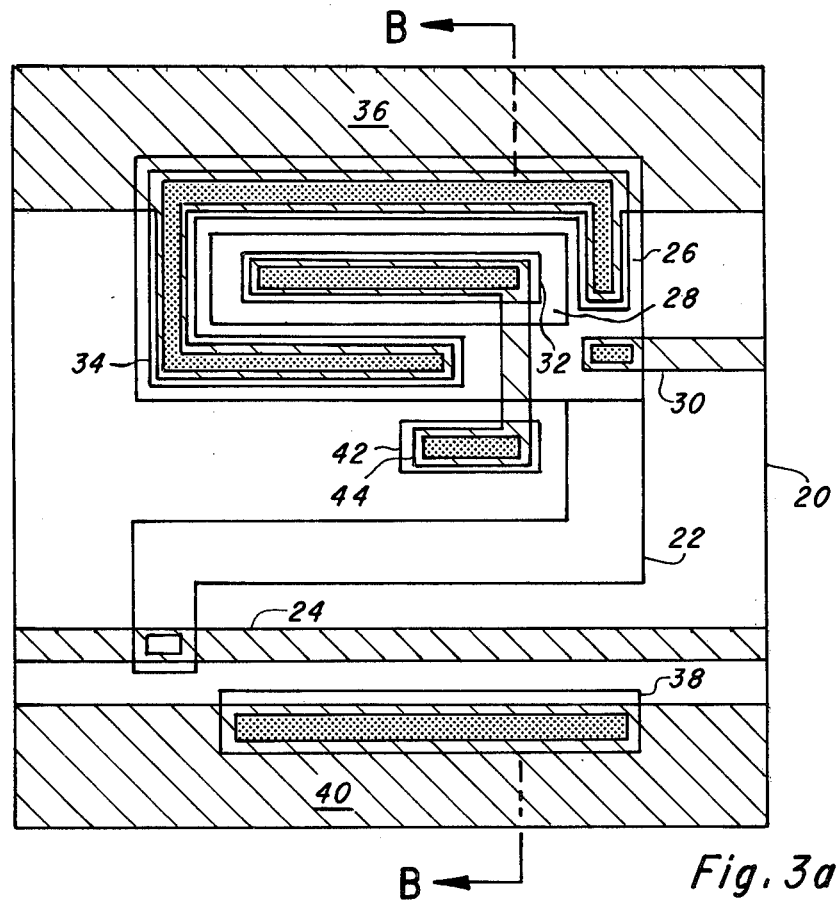
FIGS. 3a and 3b show a mesa incorporating a latching type heater network.

FIG. 1a illustrates a 5×7 heater element array of semiconductor mesas located within the window 3 over which thermally sensitive material is positioned to form a dynamic information display of the type described in U.S. Pat. No. 3,323,341 by J. W. Blair et al. in which the described thermochromic materials are used or over which is passed a specially treated thermally sensitive material to form a permanent information display or printer of the type described in U.S. pat. No. 3,496,333 by Emmons et al. FIG. 1b is a sectional view of the structure taken along line AA of FIG. 1a.

A monocrystalline semiconductor wafer 2 is mounted on a larger insulating support 1 which may be any suitable material, for example, ceramic, glass, or sapphire, by way of an insulating adhesive having good thermal and electrical insulating properties such as epoxy.

Each heater element of the array comprises a monocrystalline semiconductor body in a mesa shape and contains a heater element formed therein at the underside of the mesa adjacent the support 1 so that when the heater element is energized, the mesa is heated to provide a localized dot on the thermally sensitive material above it. A group of selectively energized heater elements forms a group of dots on the thermally sensitive material, defining a character or information representation displayed on the thermally sensitive material.

The mesas comprising the heater element array are air isolated from each other and joined by a metallic connecting pattern underneath the mesas between the semiconductor wafer 2 and the support 1. The pattern interconnects the heater elements in the mesas in the desired circuit configuration. The semiconductor wafer 2 is integral except within the window 3 in which are located the air isolated heater elements and consequently the top surface of the semiconductor wafer 2 presents a good, more uniform support for the positioning or passinng of the thermally sensitive material over the heater element array.

The metallic connecting pattern located between the semiconductor wafer 2 and the support 1 extends out into bonding pads located above the openings 4 and 5 in the support 1 so that external connection can be made to these bonding pads through the openings at the underside of support 1 thereby being removed from the thermally sensitive material located above the mesas. The metallic connecting pattern located between the semiconductor wafer 2 and the support 1 mechanically and electrically joins the air isolated mesas and bonding pad areas and is supported in the epoxy adhesive resting between the semiconductor wafer 2 and the support 1.

Each mesa contains a transistor heater network which is selectively energized so that the power dissipated by the network causes the "hot-spot" at the top surface of the selected mesa. The network in each mesa provides an active control or amplifying function in the manner that the heat generated by it facilitates the creation of the hot-spot, and may be driven directly by typical logic circuits such as TTL logic type circuits. Moreover, the heater network functions in a regenerative manner such that, once turned on by the input logic signals, the network continues to generate a hot-spot irrespective of subsequent changes in the input logic signal levels and until the supply voltage is removed.

The heater network located in each mesa is illustrated schematically in FIG. 2. The X input logic signal is coupled by resistor 10 to the base of NPN heater transistor 12. A Y input logic signal is coupled directly to the base of transistor 12. The weighting resistor for the Y input, corresponding to weighting resistor 10 of the X input, is located on the semiconductor wafer of the printhead, but not in the mesa itself. The emitter of transistor 12 is grounded while its collector is returned to a positive voltage supply $V_{CC}$ through collector resistor 16. A PNP transistor 14 has a collector which is common with the base of transistor 12 and a base which is common with the collector of transistor 12. The emitter-base junction of transistor 14 is connected across a portion of collector resistor 16.

Operationally, during quiescent periods one or both of the X and Y input logic signal levels will be low and heater transistor 12 will be off. There is a weighted summation of X and Y input logic signal levels at the base of transistor 12 and both inputs are required to occupy the high state to initiate turn-on of transistor 12. When both the X and Y input logic levels switch to the high state, a current begins to flow in the collector circuit of transistor 12. This causes a voltage drop across the portion of resistor 16 which is coupled across the emitter-base junction of transistor 14. This voltage drop is of proper polarity to forward bias the emitter-base junction of transistor 14 and cause this transistor to conduct. The collector current in transistor 14 provides additional base drive to transistor 12 thereby causing transistor 12 to conduct more heavily. This regenerative action causes a rapid build up of the collector current in transistor 12 until the saturation state is reached. Thereafter, the regenerative action maintains transistor 12 in the conducting state independent of changes in the X and Y input signal logic levels. Heater transistor 12 will cease to conduct only when the $V_{CC}$ voltage supply is turned off. It should also be noted that, as a result of the regenerative action, very little current drive is required of the X and Y input signals to initiate turn on. Consequently, these input signals can be provided by conventional logic circuits.

FIG. 3a is a bottom view of a typical mesa and serves to illustrate the implementation of the heater circuit shown schematically in FIG. 2. The bulk material of the mesa 20 is N-type monocrystalline silicon. There are formed at the bottom surface of the mesa a plurality of diffused regions yet to be discussed. As is well known in the art, the entire bottom surface of the mesa including the diffused regions is covered with a thin layer of insulating material such as silicon dioxide. The silicon dioxide layer is etched away only in those areas where it is desired to make contact with the underlying semiconductor material. A thin layer of metallic conductive material is formed over selected portions of the insulating layer for the purpose of providing electrical connections to and between portions of the underlying semiconductor material. In FIG. 3a, areas of the mesa where these metallic conducting patterns exist are shown by cross hatching. Shaded areas indicate that the insulating layer has been etched away to permit the overlying metal layer to make ohmic contact with the underlying semiconductor material.

A diffused region 22 containing P-type silicon forms resistor 10 of FIG. 2. As seen in FIG. 3a, ohmic contact is made between one end of diffused region 22 and metallic conductive strip 24 which carries the X input logic signal for the mesa. The other end of diffused region 22 is in contact with a second P-type diffused region 26 which forms the base of transistor 12. It is important to note that diffused region 26 does not include the area indicated by reference designator 28. Ohmic contact is provided between base diffusion 26 and metallic conducting strip 30 which carries the Y logic input to the mesa. Diffusions 22 and 26, forming resistor 10 and the base of transistor 12 respectively, are made at the same time thereby insuring an ohmic contact between these two circuit elements. During this same diffusion step a third P-type diffusion is formed in region 32. Diffusion 32 constitutes the emitter of transistor 14 in FIG. 2.

A second diffusion step provides a series of N+ doped regions at selected points of the mesa. The first of these, indicated by reference designator 34, forms the emitter of transistor 12. It is seen to be formed within the P type diffusion 26 which forms the base of transistor 12 and the collector of transistor 14. Thus, transistor 12 comprises an emitter located nearest the bottom surface of the mesa a base region below and around the emitter region and finally a collector which comprises the bulk N-type material of the mesa located below and around the base region. In particular, the N-type material located in region 28 forms part of the collector of transistor 12. The N-type material in region 28 also comprises the base of transistor 14 which, as seen in FIG. 2, is common with the collector of transistor 12. Similarly, base diffusion 26 of transistor 12 also comprises the collector of transistor 14. Thus, transistor 14 comprises, in lateral relationship at the bottom surface of mesa 20, a P-type diffused collector region 26, an N-type base region 28, and a P-type emitter diffusion 32. As seen in FIG. 3a, an ohmic contact is formed between the ground conducting plane 36 and the emitter diffusion 34 of transistor 12.

A second region of N+ type material formed by the second diffusion is indicated by reference designator 38. This N+ type region provides a convenient means for establishing electrical contact between the $V_{CC}$ conducting plane 40 and the underlying N type material, it being difficult to establish ohmic contact directly between the metallic conductor and N-type material. A conductive path in the bulk material of mesa 20 extends from the transistor 12 collector region surrounding base diffusion 26 to the N+ doped region 38. This conductive path comprises resistor 16 of FIG. 2.

A third N+ doped region, formed by the second diffusion, is indicated by reference designator 42. N+ diffusion 42 provides a convenient electrical connection between conductive strip 44 and a point in the bulk material intermediate along the length of resistor 16. Consistent with the schematic diagram of FIG. 2, this intermediate point along resistor 16 is coupled by conducting strip 44 to the emitter of transistor 14, that is emitter diffusion 32.

Figure 3B:
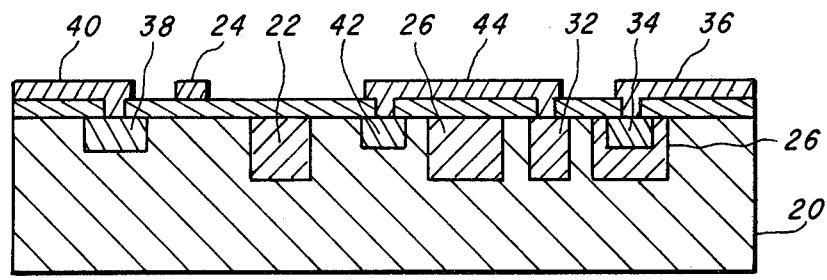

A cross sectional view, taken along line BB of FIG. 3a, is shown in FIG. 3b. Formed in the N-type bulk material of the mesa 20 is the P-type base diffusion 26 of transistor 12, appearing at two locations along this section. Transistor 14 emitter diffusion 32 and resistor 10 diffusion 22 also appear along this section. An ohmic contact is formed between the transistor 12 emitter diffusion 34 and ground conducting strip 36. Conducting strip 44 electrically couples the transistor 14 emitter diffusion 32 to the point on resistor 10 underlying N+ diffusion 42. $V_{CC}$ conducting strip 40 makes ohmic contact with N+ doped region 38 and thence to the end of resistor 16 underlying region 38.

FIGS. 3a and 3b illustrate the configuration of a typical mesa of the printhead. The exact location of the various diffusions and metallization patterns will vary slightly from mesa to mesa depending on the relative location in the printhead. Also, it will be noted that additional conducting strips will be formed at the bottom of some mesas for the purpose of conducting Y input logic signals to other mesas of the printhead. This will be seen more clearly by consideration of the metallization pattern for an entire printhead illustrated in FIG. 4.

Figure 4:
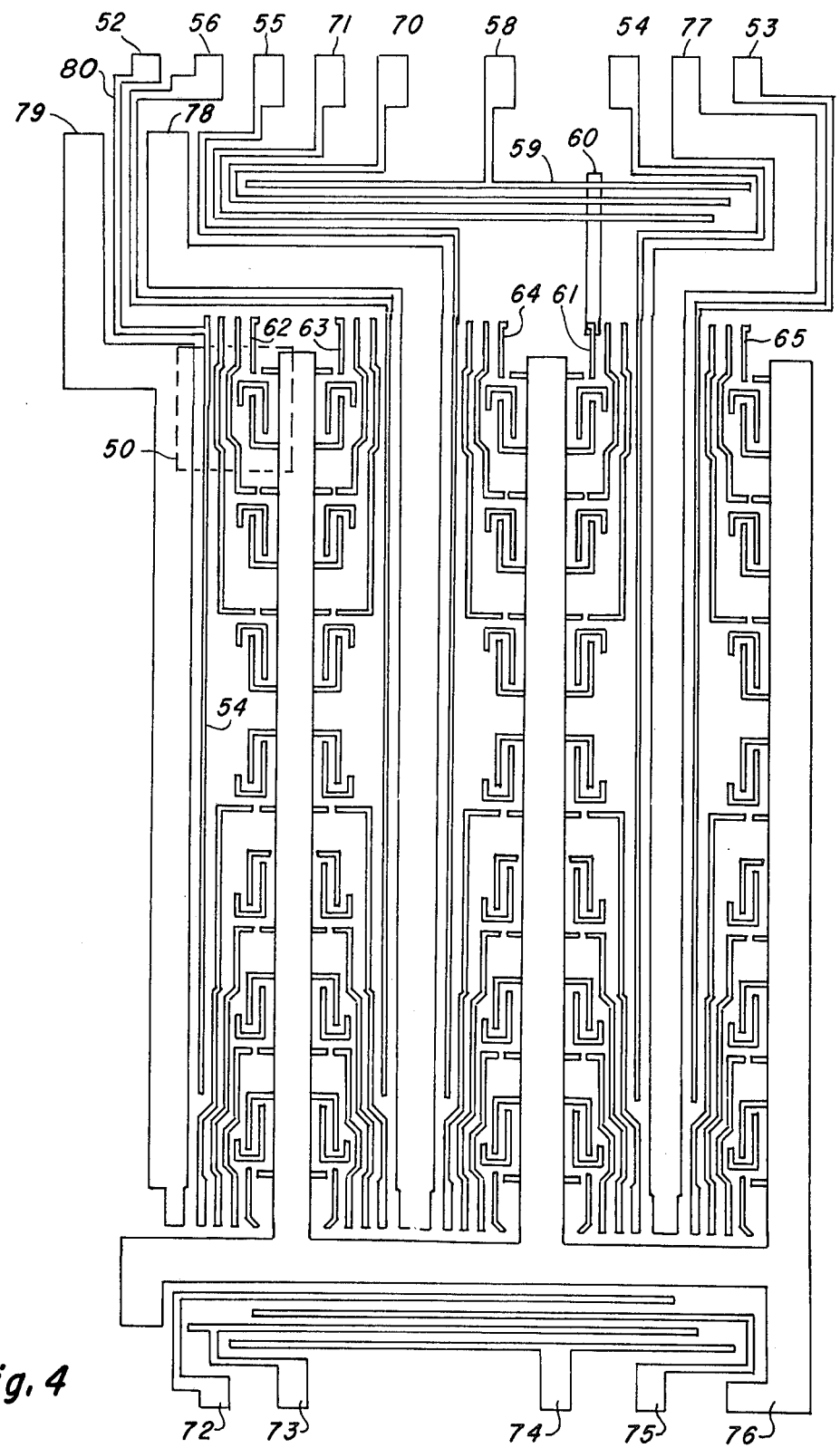
FIG. 4 is a metallization pattern for the thermal printhead.

The metallization pattern of FIG. 4 is for a printhead having a 5×7 matrix of mesas each of which includes the heater network of the present invention. A representative mesa location is shown by dashed rectangle 50. External connections to the printhead are made at a series of bonding pads in two areas corresponding to areas 4 and 5 of FIG. 1a. The X5 input, for example, is connected to bonding pad 52 and from there by conducting strip 80 to mesa 50 as well as each of the other 6 mesas in the fifth column of the matrix. Similarly, the X iputs for columns 1 through 4 of the matrix are connected at bonding pads 53 through 56 respectively. The Y1 input, that is the Y logic signal for the first row of the matrix, is connected at bonding pad 58. It will be noted in FIG. 4 that there is no continuous conducting strip coupling bonding pad 58 to the mesa area of the printhead since any such conductor would have to cross regions occupied by other conducting strips. Bonding pad 58 is connected to conductive strip 59 which extends substantially across the entire top of the printhead. The corresponding conductive strip at one of the mesas is indicated by conductive strip 61. To complete the connection, P-type diffusion 60 is formed at the surface of the semiconductor wafer. Ohmic contacts are formed to doped region 60 at the points where conductive strips 59 and 61 overlay it. Doped region 60 functions as a weighting resistor for the Y input logic signal that is connected to bonding pad 58. Corresponding conductive tunnels are formed between conductive strip 59 and each of conductive strips 62 through 65. In this way the Y1 input, coupled to bonding pad 58, will appear at each of the mesas in the first row of the matrix. The Y inputs corresponding to rows 2–7 of the matrix are connected at bonding pads 70–75, respectively. Each of these bonding pads is associated with a conductive strip extending substantially across either the top or the bottom of the printhead structure and is further coupled to the mesa area of the printhead by means of conductive tunnels similar to tunnel 60. The ground reference for the printhead is connected at bonding pad 76. Similarly, the $V_{CC}$ input to the printhead is connected at bonding pads 77, 78 and 79.

Figure 5A:
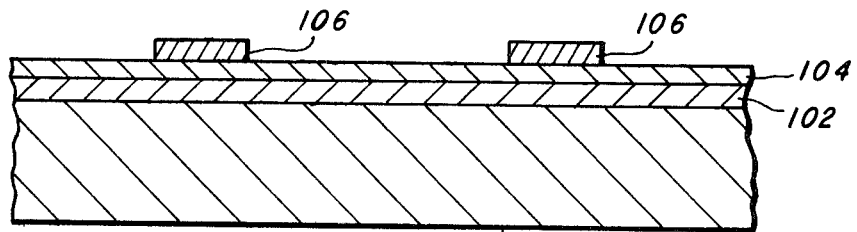
FIGS. 5a–5g illustrate the fabrication of the thermal printhead.
Figure 5B:
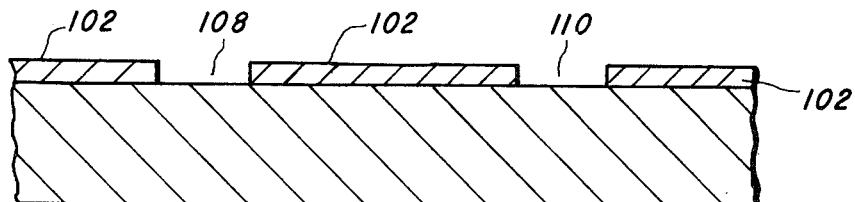

Methods for fabricating structures such as the preferred embodiment of the present invention are well known in the art. One such method is disclosed in U.S. Pat. No. 3,769,562 to Kenneth E. Bean and assigned to the assignee of the present invention. This method will be briefly summarized here in connection with FIGS. 5a through g. As shown in FIG. 5a the mesas are formed in a wafer 100 of N-type monocrystalline silicon. The surface of silicon wafer 100 is oxidized to form a layer 102 of silicon dioxide. The oxide layer 102 is then selectively removed by the well known photolithographic process using photoresist material. Briefly stated, this technique includes coating the oxidized surface with a thin layer of photoresist lacquer 104. A photographic mask, opaque in those areas 106 from which the oxide layer 102 is to be removed, is positioned above the photoresist layer 104. After exposure of the photoresist by ultraviolet light the photoresist underlying opaque areas 106 is removed by a solvent and after baking to harden the remaining photoresist the wafer 100 is immersed in a hydrofloric acid solution to etch away the silicon oxide and form in the silicon layer 102 two openings 108 and 110 (FIG. 5b).

Figure 5C:
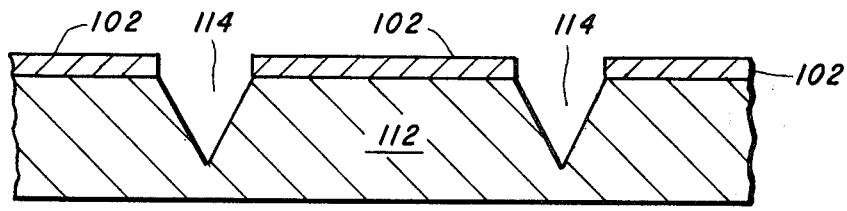
Figure 5D:
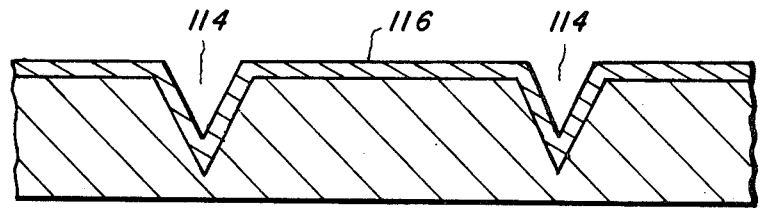

The masked wafer is then subjected to an orientation dependent etch solution to form therein V-shaped grooves or moats 114 which serve to define the mesas 112 (FIG. 5c). After the mesas are formed, the remaining photoresist material may be removed and the top surface of the slice is covered with a wear and silicon etch resistant coating 116 (FIG. 5d). The coating may be of a material such as silicon carbide, silicon nitride, silicon dioxide, or a combination of these, for example. It may be grown over silicon dioxide layer 102 (FIG. 5c) or directly on the wafer material after removal of layer 102.

After the cover layer 116 has been grown over the mesas 112 and moats 114, a layer 144 (FIG. 5e) of material, for example, polycrystalline semiconductor material, is deposited over the top surface of the slice 100 adjacent to the cover layer 116 to form a mechanically rigid structure. The most common method of deposition is by the hydrogen reduction of silicon tetrochloride, a technique well known in the art and requiring no elaboration here.

Figure 5E:
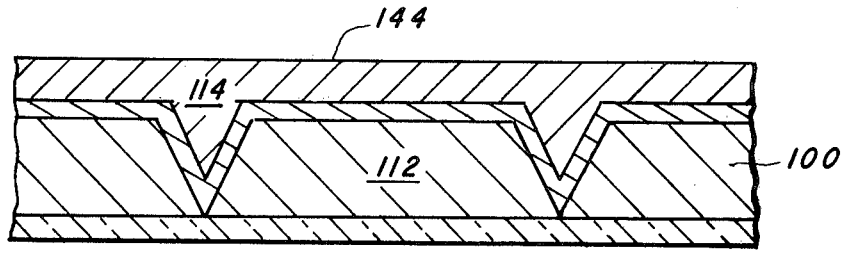

As the next step in the fabrication of the thermal printhead, the wafer 10 of FIG. 5e is subjected to a lapping and polishing treatment on its lower surface to remove all the original silicon material except that portion remaining within the mesas defined by the moats. The lapping and polishing treatment is continued until enough material has been removed from the lower surface of wafer 10 to visually expose the cover layer 116 at the bottoms of the moats.

Figure 5F:
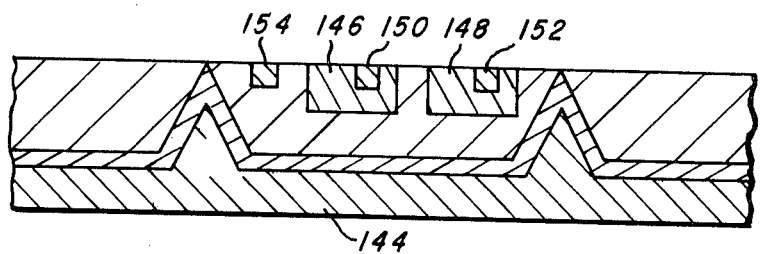

The next step is to invert the structure and, looking at what was the bottom or lower surface of the wafer 100 of FIG. 5e but will now be considered the top face of the unit, the structure appears as in FIG. 5f. Mesa regions 112 now serve as regions into which subsequent diffusions or implantations or upon which epitaxial depositions may be made in order to fabricate the circuit of each heating element. In the preferred embodiment of the present invention, diffusion processes are used for the circuit implementation and consideration of FIGS. 3a and 3b will reveal that only two diffusions are required per printhead. It will be recalled that the wafer material in the preferred embodiment comprises N-type silicon. A first diffusion forms P-type resistor region 22, base region 26 and emitter region 32, and is shown symbolically in 5f at 146 and 148. A second diffusion forms N+ type emitter region 34 and contacts regions 38 and 42. These are represented in FIG. 5f at 150, 152 and 154.

Figure 5G:
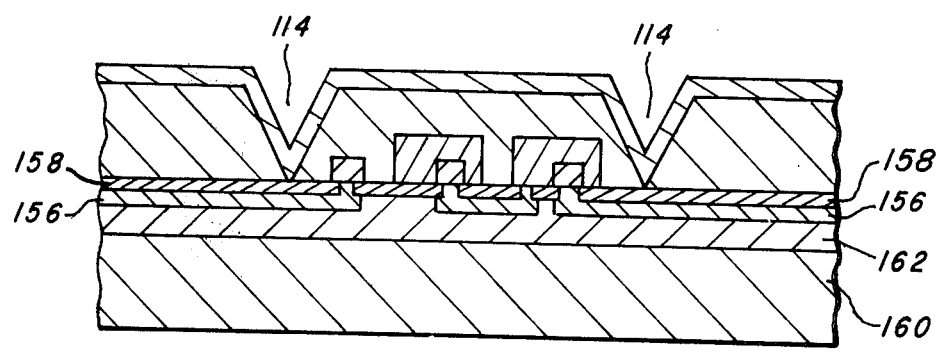

As seen in FIG. 5g, after the diffusions have been formed the metallic conducting pattern of FIG. 4 is deposited on the printhead at the back side of the mesas. The metallic material 156 is insulated from the silicon of the mesas by a thin oxide insulating layer 158. Selectively located openings in oxide layer 158 permit the metallic material 156 to form ohmic contact with appropriately chosen portions of the diffusions. Techniques for forming the diffusions and the metallic connecting pattern are well known in the art and need no further description here.

Further, as seen in FIG. 5g, the array of mesas is then mounted upon, e.g., a ceramic substrate 160 with a suitable adhesive such as epoxy shown generally at 162. Finally, the polycrystalline layer is partially or completely removed resulting in the structure shown in FIG. 5g whereby each of the mesa thermal printing elements are isolated from each other by the dielectric layer of, for example, silicon carbide, silicon nitride, or silicon dioxide and any polycrystalline silicon remaining in the moats 114.

There has been disclosed a thermal printhead structure employing a new heater circuit within each individual mesa of the printhead. The new circuit has a latching feature, that is, once turned on the circuit continues to generate a hot-spot in the mesa independent of subsequent changes in the input signal logic levels. The circuit continues to generate a hot-spot until its supply voltage is removed. Although the invention has been described in connection with a printhead having a rectangular array of mesas, other related applications are possible. It is possible to construct a line printer having but a single row of mesas, for example. In such a case, if the printer were to have 100 character positions across the page, it might employ a line of 500 mesas divided into groups of five corresponding to each character. The thermally sensitive paper overlying the printhead then might be advanced sequentially in seven steps to print a single line of characters. After each step appropriately selected ones of the mesas are turned on to produce an impression on the paper. While the mesas in such an application are not physically arranged in matrix form, they can be conceptually regarded as forming a matrix. It will be seen, therefore, that the X–Y coincidence addressing technique made possible by the heater circuit of the present invention may be used in such an application.

It is to be understood that the described embodiment is really illustrative of the invention. Numerous other arrangements may be devised by those skilled in the art without departing from the spirit ans scope of the invention as defined by the appended claims.

What is claimed is:

1. In a thermal printhead which comprises a plurality of semiconductor mesas, each responsive to at least one input signal for generating a hot-spot at a surface thereof, the improvement comprising:
    a. heater means in each of said mesas for converting electrical energy to heat energy to form a hot-spot, and
    b. latching means in each of said mesas, operatively connected to said at least one input signal for energizing said heater means in response to preselected levels of said at least one input signal, and for maintaining said heater means in an energized state despite subsequent changes in the levels of said at least one input signal.

2. The thermal printhead of claim 1 further comprising a voltage supply, independent of said input signal, for furnishing electrical power to said mesas, and wherein said heater means, once energized, are de-energized by removal of said voltage supply.

3. The thermal printhead of claim 1 wherein said latching means in each of said mesas is operatively connected to two input signals.

4. A latching heater circuit for use in a mesa of a thermal printhead having a direct current power supply, said latching heater circuit comprising:
    a. a heater transistor operatively connected to at least one input signal and responsive to preselected levels in said at least one input signal to begin conduction of a heating current, and
    b. regenerative circuit means responsive to said heating current for providing independent drive to said heater transistor, whereby, once initiated, said heater current builds up to a saturation level and remains at said saturation level despite subsequent variations in the levels of said at least one input signal.

5. The latching heater circuit of claim 4 wherein the base of said heater transistor is operatively connected to said at least one input signal, the emitter is coupled to a first reference potential, and the collector is coupled through a collector resistor to a second reference potential.

6. The latching heater circuit of claim 5 wherein said regenerative circuit means comprises a second transistor with its emitter-base junction coupled across at least a portion of said collector resistor, and its collector operatively connected to the base of said heater transistor.

7. A thermal printhead comprising a plurality of semiconductor means, each switchable from a quiescent to a heat dissipating state in response to coincidence addressing by at least two input signals, and each mesa including means for maintaining the mesa in the heat dissipating state despite changes in said at least two input signals subsequent to said coincidence addressing.

* * * * *

UNITED STATES PATENT OFFICE
CERTIFICATE OF CORRECTION

Patent No. 3,988,569            Dated October 26, 1976

Inventor(s) W. S. Henrion

It is certified that error appears in the above-identified patent and that said Letters Patent are hereby corrected as shown below:

Claim 7, line 2, change "means" to --mesas--.

Signed and Sealed this

Fourteenth Day of June 1977

[SEAL]

Attest:

RUTH C. MASON
*Attesting Officer*

C. MARSHALL DANN
*Commissioner of Patents and Trademarks*